US009461667B2

(12) United States Patent
Quinnell (10) Patent No.: US 9,461,667 B2
(45) Date of Patent: Oct. 4, 2016

(54) ROUNDING INJECTION SCHEME FOR FLOATING-POINT TO INTEGER CONVERSION

(71) Applicant: Eric C. Quinnell, Austin, TX (US)

(72) Inventor: Eric C. Quinnell, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 318 days.

(21) Appl. No.: 14/243,568

(22) Filed: Apr. 2, 2014

(65) Prior Publication Data

US 2015/0186111 A1     Jul. 2, 2015

Related U.S. Application Data

(60) Provisional application No. 61/922,081, filed on Dec. 30, 2013.

(51) Int. Cl.
G06F 5/00      (2006.01)
H03M 7/24     (2006.01)

(52) U.S. Cl.
CPC .................................... *H03M 7/24* (2013.01)

(58) Field of Classification Search
None
See application file for complete search history.

(56) References Cited

U.S. PATENT DOCUMENTS

| 5,257,215 | A |  | 10/1993 | Poon |  |
|---|---|---|---|---|---|
| 5,892,698 | A |  | 4/1999 | Naffziger |  |
| 6,131,104 | A | * | 10/2000 | Oberman | G06F 7/483 708/204 |
| 6,205,461 | B1 |  | 3/2001 | Mansingh |  |
| 6,366,942 | B1 |  | 4/2002 | Badeau et al. |  |
| 7,433,911 | B2 |  | 10/2008 | Lutz et al. |  |
| 8,386,755 | B2 |  | 2/2013 | Elmer et al. |  |
| 2012/0124116 | A1 |  | 5/2012 | Yu et al. |  |
| 2012/0215823 | A1 |  | 8/2012 | Lutz |  |
| 2015/0039661 | A1 | * | 2/2015 | Blomgren | H03M 7/24 708/204 |
| 2015/0186111 | A1 | * | 7/2015 | Quinnell | H03M 7/24 708/205 |

OTHER PUBLICATIONS

G. Even et al., "A comparison of three rounding algorithms for IEEE floating-point multiplication", Computers, IEEE Transactions on (vol. 49 , Issue: 7), Aug. 29, 1998.

* cited by examiner

*Primary Examiner* — David H Malzahn
(74) *Attorney, Agent, or Firm* — Renaissance IP Law Group LLP (57) ABSTRACT

According to one general aspect, an apparatus may include a memory, a normalization engine, a lookup table, and an adder. The memory may be configured to store a floating-point number formatted in a floating-point format. The normalization engine may be configured to normalize at least a portion of the floating-point number to create a normalized number. The lookup table may be configured to generate an injection constant based upon a predefined set of rounding values specifically for converting a floating-point number to an integer number. The adder may be configured to create an integer result by adding the normalized number and the injection constant.

20 Claims, 9 Drawing Sheets

FIG. 2 200

| Rounding Mode | Round Bit Injection | Sticky Bit Injection | Carry in |
|---|---|---|---|
| Round to Zero | sign | sign | sign |
| Round to Minus Inf | 0 | 0 | sign |
| Round to Positive Inf | 1 | 1 | sign |
| Round to Nearest Even | 1 | 0 | sign |

| Rounding Mode | | | | | |
|---|---|---|---|---|---|
| Round to Zero | | | | | |

| | | sign | sign | | |
|---|---|---|---|---|---|
| | Round Bit Injection | sign | Sticky Bit Injection | | |
| | + | | Carry in | | |

| Sign | 4-bit number | Round Bit | Sticky Bit | 4-bit Result | Correct? 316 |
|---|---|---|---|---|---|
| 0 | 0010 | 0 | 0 | 0010 | Y |
| 0 | 0010 | 0 | 1 | 0010 | Y |
| 0 | 0010 | 1 | 0 | 0010 | Y |
| 0 | 0010 | 1 | 1 | 0010 | Y |
| 0 | 0011 | 0 | 0 | 0011 | Y |
| 0 | 0011 | 0 | 1 | 0011 | Y |
| 0 | 0011 | 1 | 0 | 0011 | Y |
| 0 | 0011 | 1 | 1 | 0011 | Y |

| Sign | ~(4-bit number) | ~(Round Bit) | ~(Sticky Bit) | 4-bit Result | Correct? 318 |
|---|---|---|---|---|---|
| 1 | 1101 | 1 | 1 | 1110 | Y |
| 1 | 1101 | 1 | 0 | 1110 | Y |
| 1 | 1101 | 0 | 1 | 1110 | Y |
| 1 | 1101 | 0 | 0 | 1110 | Y |
| 1 | 1100 | 1 | 1 | 1101 | Y |
| 1 | 1100 | 1 | 0 | 1101 | Y |
| 1 | 1100 | 0 | 1 | 1101 | Y |
| 1 | 1100 | 0 | 0 | 1101 | Y |

| Rounding Mode | | | | | | |
|---|---|---|---|---|---|---|
| Round to Minus Inf | | | | | | |
| | | | | sign | 322 | |
| | | | | 0 | Carry in Sticky Bit Injection | |
| Sign | 4-bit number | Round Bit Injection | Round Bit | Sticky Bit | 4-bit Result | Correct? |
| 0 | 0010 | 0 | 0 | 0 | 0010 | Y |
| 0 | 0010 | | 0 | 1 | 0010 | Y |
| 0 | 0010 | | 1 | 0 | 0010 | Y |
| 0 | 0010 | | 1 | 1 | 0010 | Y |
| 0 | 0011 | | 0 | 1 | 0011 | Y |
| 0 | 0011 | | 1 | 0 | 0011 | Y |
| 0 | 0011 | | 1 | 1 | 0011 | Y |
| Sign | ~(4-bit number) | + | ~(Round Bit) | ~(Sticky Bit) | 4-bit Result | Correct? |
| 1 | 1101 | + | 1 | 1 | 1110 | Y |
| 1 | 1101 | | 0 | 1 | 1101 | Y |
| 1 | 1101 | | 1 | 0 | 1101 | Y |
| 1 | 1101 | | 0 | 0 | 1101 | Y |
| 1 | 1100 | | 1 | 1 | 1101 | Y |
| 1 | 1100 | | 0 | 1 | 1100 | Y |
| 1 | 1100 | | 0 | 0 | 1100 | Y |

| Rounding Mode | | | | |
|---|---|---|---|---|
| Round to Positive Inf | | | sign | 332 |
| Round Bit Injection | | 1 | 1 | Carry in Sticky Bit Injection |
| + | | | | |
| Sign | 4-bit number | Round Bit | Sticky Bit | 4-bit Result | Correct? |
| 0 | 0010 | 0 | 0 | 0010 | Y |
| 0 | 0010 | 0 | 1 | 0011 | Y |
| 0 | 0010 | 1 | 0 | 0011 | Y |
| 0 | 0010 | 1 | 1 | 0011 | Y |
| 0 | 0011 | 0 | 1 | 0100 | Y |
| 0 | 0011 | 1 | 0 | 0100 | Y |
| 0 | 0011 | 1 | 1 | 0100 | Y |
| Sign | ~(4-bit number) | ~(Round Bit) | ~(Sticky Bit) | 4-bit Result | Correct? |
| 1 | 1101 | 1 | 1 | 1110 | Y |
| 1 | 1101 | 1 | 0 | 1110 | Y |
| 1 | 1101 | 0 | 1 | 1110 | Y |
| 1 | 1101 | 1 | 0 | 1101 | Y |
| 1 | 1100 | 1 | 1 | 1101 | Y |
| 1 | 1100 | 0 | 1 | 1101 | Y |
| 1 | 1100 | 0 | 0 | 1101 | Y |

| Rounding Mode | | | | | |
|---|---|---|---|---|---|
| Round to Nearest Even | | | | | |

| + | | sign | 0 | 342 | |
|---|---|---|---|---|---|
| Round Bit Injection | | 1 | | Carry in / Sticky Bit Injection | |
| Sign | 4-bit number | Round Bit | Sticky Bit | 4-bit Result | Correct? |
| 0 | 0010 | 0 | 0 | 0010 | Y |
| 0 | 0010 | 0 | 1 | 0010 | Y |
| 0 | 0010 | 1 | 0 | 0011 | N ~346 |
| 0 | 0010 | 1 | 1 | 0011 | Y |
| 0 | 0011 | 0 | 0 | 0011 | Y |
| 0 | 0011 | 0 | 1 | 0011 | Y |
| 0 | 0011 | 1 | 0 | 0100 | Y |
| 0 | 0011 | 1 | 1 | 0100 | Y |
| Sign | ~(4-bit number) | ~(Round Bit) | ~(Sticky Bit) | 4-bit Result | Correct? |
| 1 | 1101 | 1 | 1 | 1110 | Y |
| 1 | 1101 | 1 | 0 | 1110 | Y |
| 1 | 1101 | 0 | 1 | 1101 | Y |
| 1 | 1101 | 0 | 0 | 1101 | Y |
| 1 | 1100 | 1 | 1 | 1101 | Y |
| 1 | 1100 | 1 | 0 | 1101 | Y |
| 1 | 1100 | 0 | 1 | 1101 | N ~348 |
| 1 | 1100 | 0 | 0 | 1100 | Y |

502 Receiving a floating point number formatted in a floating point format

504 Normalizing at least a portion of the floating point number to create a normalized number 506 Calculating at least one rounding value according to a predefined set of rounding values specifically for converting a floating-point number to an integer number 508 Adding the normalized number and the rounding value to create an integer result 510 Determining if a least-significant bit of the integer result is to be corrected, wherein the determination is based in part upon the predefined set of rounding values, and, if so, correcting the least-significant bit of the integer result

FIG. 6 600

ROUNDING INJECTION SCHEME FOR FLOATING-POINT TO INTEGER CONVERSION

CROSS-REFERENCE TO RELATED APPLICATION

This application claims priority under 35 U.S.C. §119 to Provisional Patent Application Ser. No. 61/922,081, entitled "ROUNDING INJECTION SCHEME FOR FLOATING-POINT TO INTEGER CONVERSION" filed on Dec. 30, 2013. The subject matter of this earlier filed application is hereby incorporated by reference.

TECHNICAL FIELD

This description relates to converting digital numbers between formats, and more specifically converting floating-point numbers to integer numbers.

BACKGROUND

In computing, a floating-point number generally includes a technique for representing an approximation of a real number in a way that can support a wide range of values. These numbers are, in general, represented approximately to a fixed number of significant digits and scaled using an exponent. The term "floating point" refers to the fact that a number's radix point (e.g., decimal point, or, more commonly in computers, binary point) can "float"; that is, it can be placed anywhere relative to the significant digits of the number. This position is indicated as the exponent component in the internal representation, and floating point can thus be thought of as a computer realization of scientific notation (e.g., $1.234 \times 10^3$ versus 1,234, etc.).

The Institute of Electrical and Electronics Engineers (IEEE) Standard for Floating-Point Arithmetic (IEEE 754) is a technical standard for floating-point computation established in 1985 by the IEEE. Many hardware floating-point units or circuits are substantially compliant with the IEEE 754 standard. Herein, the term "IEEE 754" refers to standards substantially complaint with the IEEE Standard for Floating-Point Arithmetic, IEEE Std. 754-2008 (29 Aug. 2008) or standards derived from or preceding that standard.

The IEEE 754 standard allows for various degrees of precision. The two more common levels of precision include a 32-bit (single) and 64-bit (double) precision. The 32-bit version of a floating point number includes a 1-bit sign bit (that indicates whether the number is positive or negative), an 8-bit exponent portion (that indicates the power of 2 where the radix point is located) and a 23-bits fraction, significant, or mantissa portion (that indicates the real number that is to be multiplied by 2 raised to the power of the exponent portion). The 64-bit version includes a 1-bit sign indicator, 11-bit exponent portion, and a 52-bit fraction portion. It is understood that the above are merely a few illustrative examples to which the disclosed subject matter is not limited.

Conversely, an integer number generally includes a number that may be written without a fractional or decimal component (e.g., 21, 4, −2048, etc.). This may be thought of as being comparable to the mantissa portion of a floating-point number. In computer science, the size or range of an integer number may be limited to the number of digits or bits used to represent the value (e.g., an 8-bit integer may represent 0-255, a 16-bit integer may represent 0-65,535, etc.). In general, an integer may be signed or unsigned. In such a system unsigned integers are understood to only include positive (or non-negative) numbers (e.g., 0-255, etc.), whereas signed integers generally offset the range at which numbers are represented such that the integer may include both positive and negative numbers (e.g., −128 to 127, −32,768 to 32,767, etc.).

SUMMARY

According to one general aspect, an apparatus may include a memory, a normalization engine, a lookup table, and an adder. The memory may be configured to store a floating-point number formatted in a floating-point format. The normalization engine may be configured to normalize at least a portion of the floating-point number to create a normalized number. The lookup table may be configured to generate an injection constant based upon a predefined set of rounding values specifically for converting a floating-point number to an integer number. The adder may be configured to create an integer result by adding the normalized number and the injection constant.

According to another general aspect, a method may include receiving a floating-point number formatted in a floating-point format. The method may include normalizing at least a portion of the floating-point number to create a normalized number. The method may also include calculating at least one rounding value according to a predefined set of rounding values specifically for converting a floating-point number to an integer number. The method may include adding the normalized number and the rounding value to create an integer result.

According to another general aspect, a system may include a memory and a floating-point conversion unit. The memory may be configured to store a floating-point number formatted in a floating-point format. The floating-point conversion unit may be configured to convert a floating-point number to an integer number. The floating-point conversion unit may include a normalization engine, a lookup table, and an adder. The normalization engine may be configured to normalize at least a portion of the floating-point number to create a normalized number. The lookup table may be configured to generate an injection constant based upon a predefined set of rounding values specifically for converting a floating-point number to an integer number. The adder may be configured to create an integer result by adding the normalized number and the injection constant.

The details of one or more implementations are set forth in the accompanying drawings and the description below. Other features will be apparent from the description and drawings, and from the claims.

A system and/or method for converting digital numbers between formats, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

As described above, in computing devices floating-point numbers are represented by a set number of bits. This means that floating-point numbers may only represent a discrete and constrained part of the infinite number space as bounded by their allocated number of bits. For a normal floating-point number, the number is represented similar to standard scientific notation format, with a whole number in the significant portion of the number and the exponent portion used to indicate where the radix point should be. For example, in a decimal system, 23,467 is represented as $2.3467 \times 10^4$, where the single digit of whole number is 2 and the radix point is 4 places to the right. When a number is represented in binary, the most significant bit is always 1. It is understood that the use of scientific notation herein is used due to its relatability to the common reader, and are merely illustrative examples. It is further understood that a preferred disclosed subject matter is focused on binary numbers.

Likewise, in computing devices integer numbers are represented by a set number of bits, but are stored in a different format. This generally means that integers represent an even smaller or more constrained part of the infinite number space bounded by their allocated number of bits. As described above, integers are generally represented in one of two main formats, signed and unsigned. Unsigned integers are generally understood to be non-negative and simply include a range from zero to the limit of the number of bits used to represent the number (e.g., an 8-bit unsigned integer may represent 0-255, etc.).

Signed integers generally include a range of values centered roughly around zero and extending substantially equally in a positive and negative direction, as limited by the number of bits used (e.g., an 8-bit unsigned integer may represent −128 to 127, etc.). However, there are two significant caveats to this statement. First, as the value zero consumes one of the possible bit combinations (of which there are an even number), the number of potential positive/negative values are not even. This is usually handled by allowing the negative numbers one more value than the positive numbers (e.g., in the 8-bit embodiment, −128 is the bottom bound as opposed to −127, which would match the positive 127 upper bound, etc.). Secondly, negative integers are generally represented and/or synonymous with by two's complement notation, as it well known to those skilled in the art. This has the benefit of making all negative numbers include a most-significant bit (MSB) of 1. Therefore, one can quickly tell by examining the MSB of a signed integer whether or not it is positive (an MSB of 0) or negative (an MSB of 1). This also results in the negative numbers having one more value than the positive numbers as the zero value takes up on the values in which the MSB equals 0.

Occasionally, a computing device may desire to convert a number stored in a floating-point format (e.g., with sign-bit, mantissa, and exponent portions) to an integer format. As one can see, at least two possible issues may arise with such a conversion process. First, as a floating-point number may include a fractional (i.e. non-whole) portion (e.g., 1.34 may include the 0.34 portion, etc.) and the conversion may consider how to represent this as an integer. Generally, such instances are handled using a set of rounding rules established in the IEEE 754 specification. Secondly, a floating-point formatted value includes a sign bit (indicating positive or negative), whereas an integer does not (the MSB of a signed integer aside). The inclusion of a dedicated sign-bit allows for a floating-point number to have a representation for 'negative zero", whereas integer numbers do not. In such an embodiment, in addition to converting the floating-point number to a normalized or fixed-point value, a two's complementation (i.e. an inversion in signed integer format) may also be required.

Figure 1:
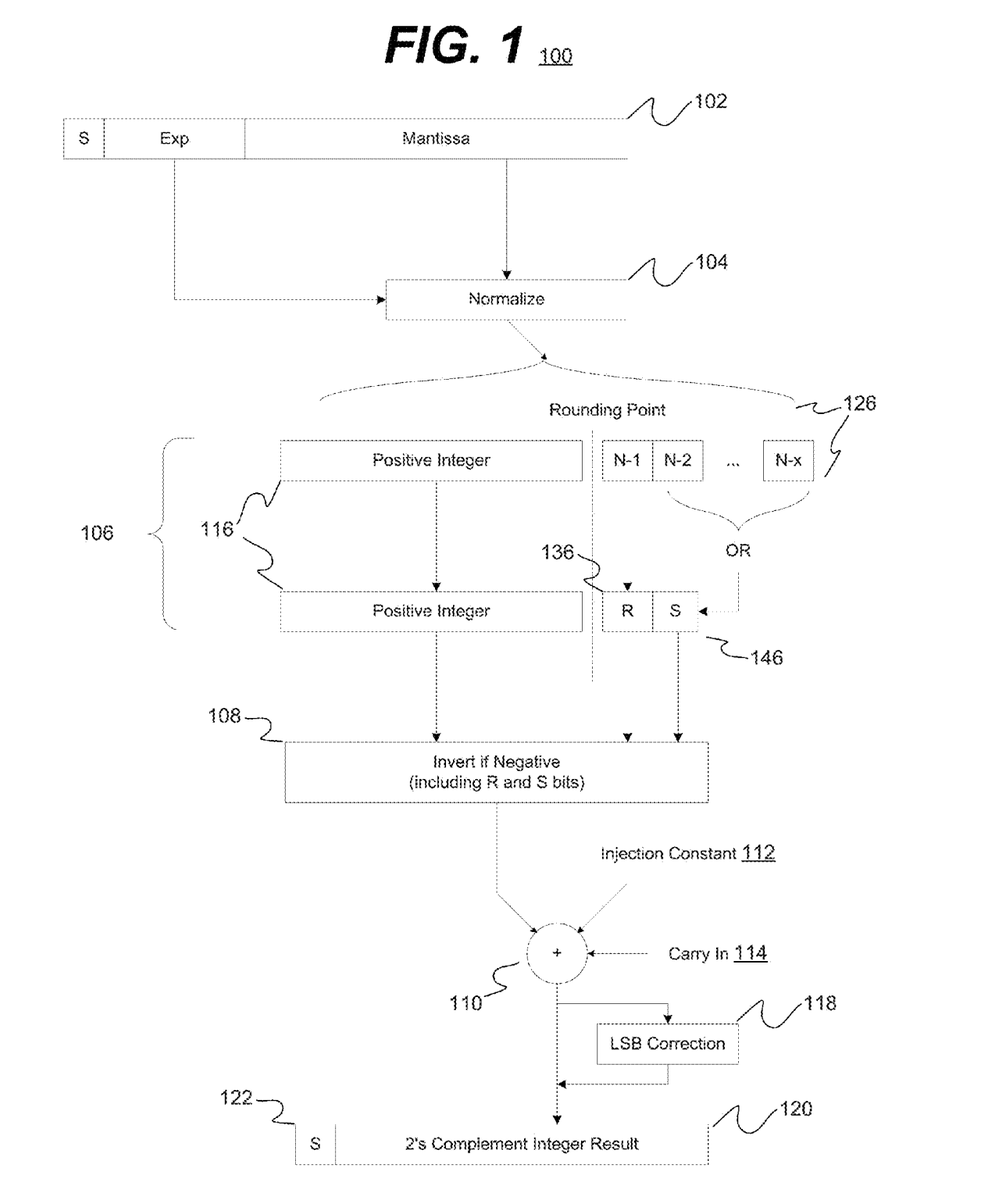
FIG. 1 is a block diagram of an example embodiment of a system in accordance with the disclosed subject matter.

FIG. 1 is a block diagram of a system 100 for converting a floating-point formatted number to an integer formatted number. In some embodiments, the system 100 may include a floating-point converter (FCVT).

In such an embodiment, the system 100 may include a register or memory 102 configured to receive and store a floating point formatted number. As described above, in various embodiments, the floating-point number may include a sign bit, an exponent portion, and a mantissa portion.

In various embodiments, the system 100 may include a normalization engine 104 configured to normalize the floating-point number. In this context, the term "normalize" refers to the process of converting the mantissa portion to a representation that includes an exponent portion of one. In general, this may include shifting the radix point (e.g., the decimal point in decimal systems, etc.) by the unbiased value of the exponent portion. For example, to use decimal values for simplicity, a floating-point number may include the value $1.234 \times 10^3$ (a mantissa of 1234, an exponent of 3, and a positive sign bit) and may be normalized to 1,234 by shifting the decimal point three times. This is not to be confused with the IEEE 754 term "denormal" or "subnormal" numbers, which while supported by this schema, are otherwise not specifically germane to the disclosed subject matter.

In the illustrated embodiment, the intermediate normalized number 106 may be represented as a positive integer 116 (e.g., the absolute value of the floating-point number, etc.). In such an embodiment, the normalized number may be aliased with no conversion as a positive two's complement formatted number.

In various embodiments, the intermediate normalized number 106 may include one or more bits or fractional values 126 beyond the rounding or radix point (e.g. in decimal, a normalized 1.25 may include the fractional value 0.25 beyond or to the right of the radix point, etc.). In such an embodiment, these various fractional values 126 may be reduced or converted into a rounding (R) bit 136 and a sticky (S) bit 146, per the IEEE 754 rules. In one such embodiment, the least significant bits may be ORed to produce the sticky bit 146.

In various embodiments, once the rounding bit 136 and sticky bit 146 have been calculated, the intermediate normalized number 106 may be prepared for rounding. In one embodiment, if the intermediate normalized number 106 is negative (e.g., determined by evaluating the sign bit of the floating-point number, etc.) the normalized number 106 may be inverted. The resultant value may include the terminal normalized number or simply "normalized number" 108. In the illustrated embodiment, this may be done via taking the one's complement of the intermediate normalized number 106. In such an embodiment, this may be less computationally intensive than taking the two's complement. In one such embodiment, such an inversion may involve only the use of a number of inverters and/or a multiplexer (to select between positive and negative versions of the intermediate normalized number 106), as opposed to a two's complement inversion that may involve the use of an adder or half-adder (e.g., to add 1 to the inversion, etc.).

In various embodiments, the system 100 may include an adder 110. In such an embodiment, the adder may accept three inputs: input A, input B, and a carry-in bit. In the illustrated embodiment, the adder 110 may receive as input the normalized number 108 and one or more injection bits or constants 112, and a carry-in value 114.

In such an embodiment, the adder 110 may be configured to properly round the normalized number 108 to generate a two's complement formatted version of the integer result 120. As described above, the IEEE 754 standard allows for a number of rounding schemes. For example, such possible rounding schemes may include: Round to Zero, Round to Minus Infinity, Round to Positive Infinity, and/or Round to Nearest Even Value. It is understood that the above are merely a few illustrative examples to which the disclosed subject matter is not limited.

In various embodiments, the system 100 may make use of a technique known as injection rounding. In such an embodiment, instead of evaluating the fractional portion of the normalized number 108 to determine whether or not to add 1 to the number (i.e. round up/down to the next number), constant values may be added to the normal number 108 and the fraction portion may be discarded. For example, again using decimal for illustrative purposes, if the normal number is 1.25, instead of determining that the fractional portion 0.25 is less than 0.5 and rounding down, it may be simpler and faster to add the constant 0.5 to 1.25, resulting in 1.75 and discard the new fractional portion (0.75), to get an integer value of 1. Likewise, if the normal number was 1.51, by adding the constant 0.5, the whole portion of the number after addition would naturally round up to 2 (2.01 with the 0.01 discarded). It is understood that the above are merely a few illustrative examples to which the disclosed subject matter is not limited and that the system 100 would make use of binary as opposed to decimal math.

In such an embodiment, the injection constants 112 may be predetermined based upon the rounding scheme or rules selected for the operation (e.g., float-to-integer conversion, etc.). In such an embodiment, the injection constants 112 may also be predetermined based upon the selected operation. For example, a first set of injection constants 112 may be employed for a float-to-integer conversion and a second set of injection constants may be employed for a float-to-float conversion (e.g., from double to single precision, etc.). In the illustrated embodiment, the disclosed subject matter deals primarily with conversion of floating point numbers to integer numbers. It is understood that the above are merely a few illustrative examples to which the disclosed subject matter is not limited.

Figure 2:
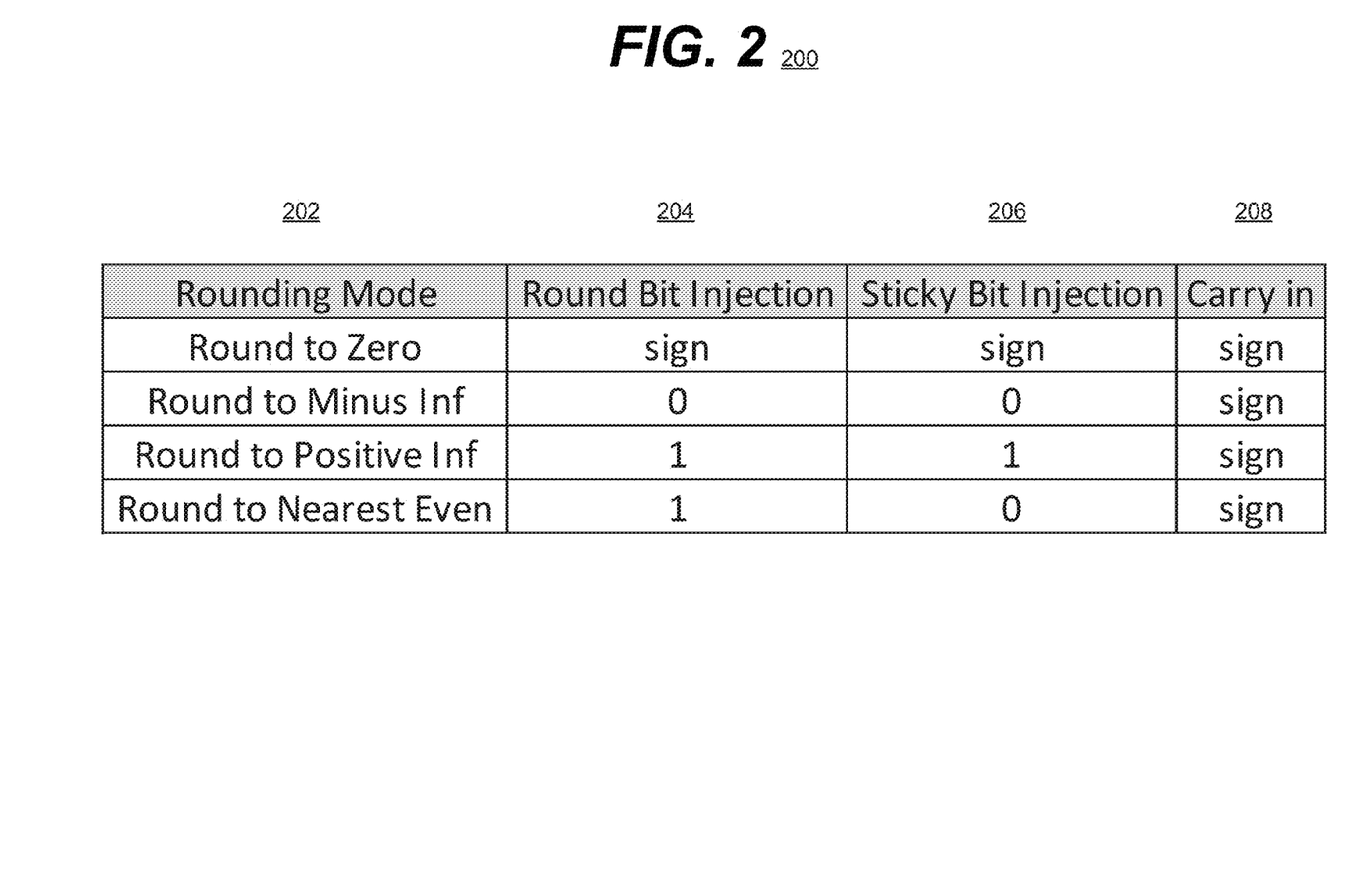
FIG. 2 is a table showing an example embodiment of injection constants in accordance with the disclosed subject matter.

FIG. 2 is a diagram of a table 200 showing injection constants for converting a floating-point formatted number to an integer formatted number. In various embodiments, the table 200 may be employed to determine the injection constants 112 of FIG. 1. It is understood that the above is merely one illustrative example to which the disclosed subject matter is not limited.

In the illustrated embodiment, the table 200 may include four possible injection constants, each based upon the selected rounding mode 202. In various embodiments, such possible rounding modes may include: Round to Zero, Round to Minus Infinity, Round to Positive Infinity, and/or Round to Nearest Even Value.

In the illustrated embodiment, the table 200 may include or dictate four possible values for a value to be injected at the rounding bit position 204 and again four possible values to be injected at the sticky bit position 206. In various embodiments, the round bit and the sticky bit may occupy the least significant bits (LSBs) of the normalized number. As such, an injection constant that includes two bits (a rounding injection bit and a sticky injection bit) may be added to the LSBs (rounding and sticky bits) of the normalized number.

In the illustrated embodiment, if the rounding mode is set to "Round to Zero" the value of both the rounding injection bit and the sticky injection bit may be equal to the value of the sign bit of the floating point number. In one embodiment, if the rounding mode is set to "Round to Minus Infinity" the value of both the rounding injection bit and the sticky injection bit may be equal to zero. In another embodiment, if the rounding mode is set to "Round to Positive Infinity" the value of both the rounding injection bit and the sticky injection bit may be equal to one. In yet another embodiment, if the rounding mode is set to "Round to the Nearest Even Number" the value of the rounding injection bit may be equal to one and the value of the sticky injection bit may be equal to zero. It is understood that the above are merely a few illustrative examples to which the disclosed subject matter is not limited.

In the illustrated embodiment, the table 200 may include or dictate a possible value for the carry-in bit 208. In some embodiments, the carry-in bit 208 may be included as part of the injection constant. In various embodiments, regardless of the rounding mode, the carry-in bit 208 may be equal to the value of the sign bit of the floating-point number.

Returning to FIG. 1, the injection constants 112 and carry-in value 114 may be dictated by a table or predefined scheme (e.g., table 200 of FIG. 2, etc.), and may be based upon one or more of: the rounding scheme or mode employed, and the sign-bit of the floating point number. As described above, the adder 110 may generate a two's complement formatted or encoded integer result 120.

Figure 3D:
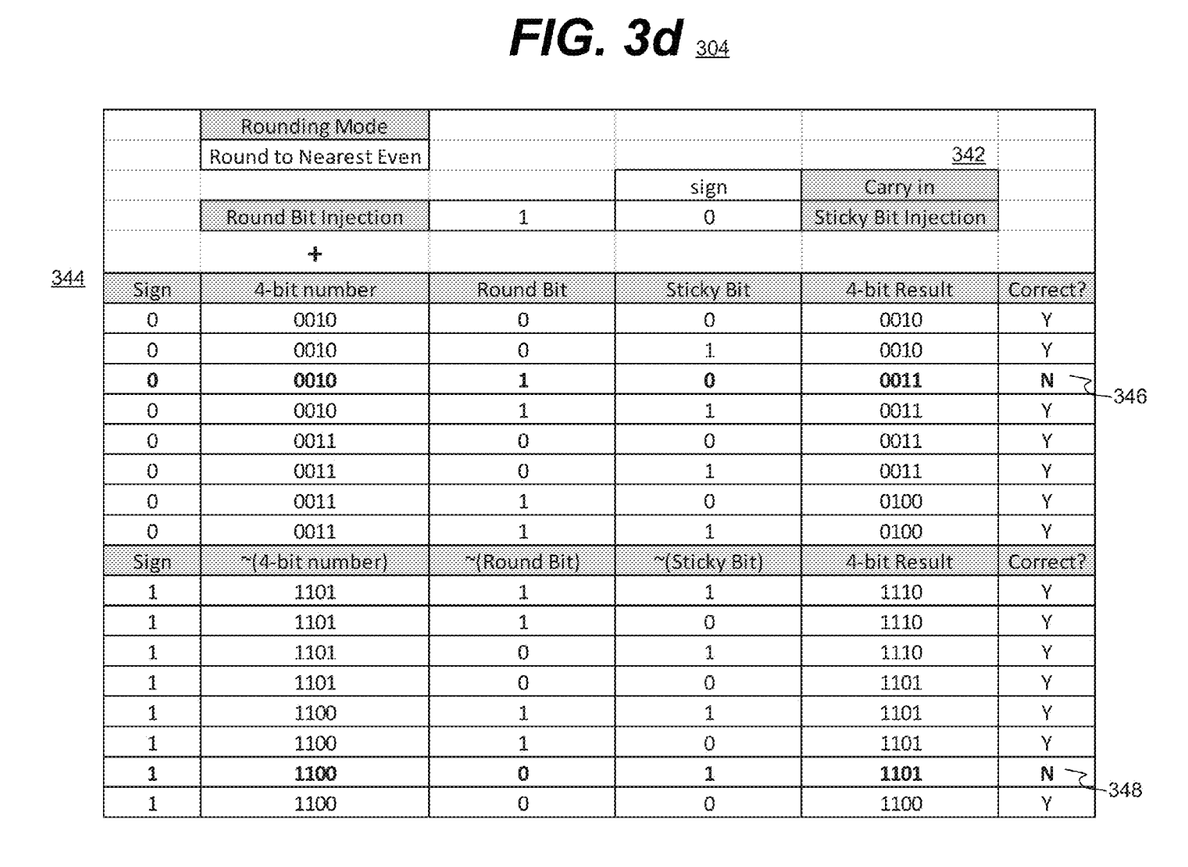
FIG. 3d is a diagram of example values employed in one embodiment of a system in accordance with the disclosed subject matter.
Figure 4:
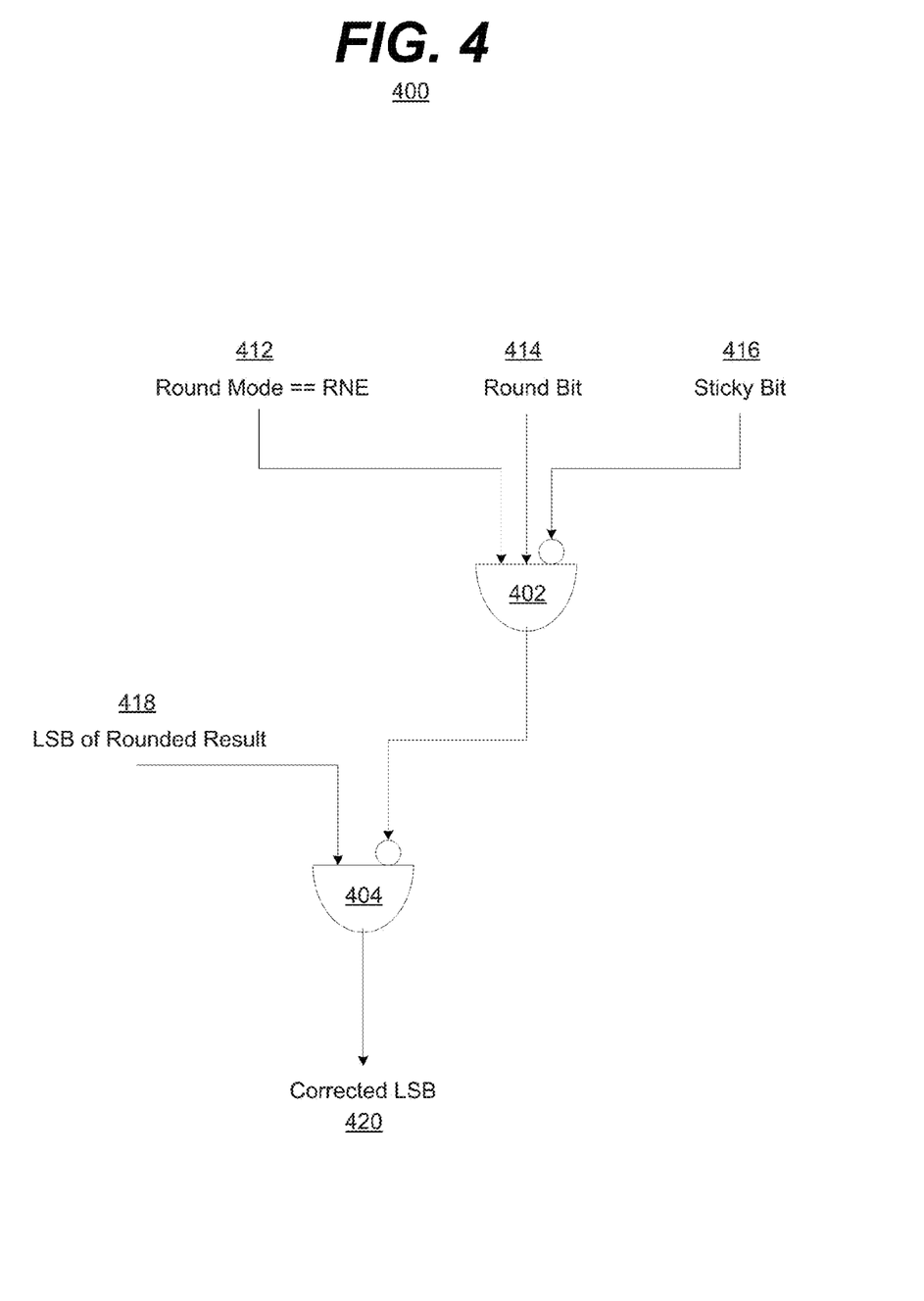
FIG. 4 is a block diagram of an example embodiment of a circuit in accordance with the disclosed subject matter.

In some embodiments, the least significant bit (LSB) of the integer result 120 may be incorrect. In various embodiments, the system 100 may include a LSB correction circuit 118 configured to adjust the LSB of the output from the adder 110, as needed. FIGS. 3d and 4 illustrate embodiments in which the LSB Correction circuit 118 may be invoked. In such an embodiment, an error may occur in certain instances when the rounding mode is set to "Round to Nearest Even Value". It is understood that the above is merely one illustrative example to which the disclosed subject matter is not limited.

As described above, the output of the adder 110 (and the LSB correction circuit 118 if invoked) may include an integer result 120 formatted or encoded in two's complement notation. In such an embodiment, the integer result 120 may be suitable for use in other computational operations (e.g., addition, subtraction, etc.). In some embodiments, the integer result 120 may be accompanied by or concatenated with a sign bit 122 (similarly to the sign bit of the floating-point number). In another embodiment, this sign bit 122 may not be included. It is understood that the above are merely a few illustrative examples to which the disclosed subject matter is not limited.

Figure 3A:
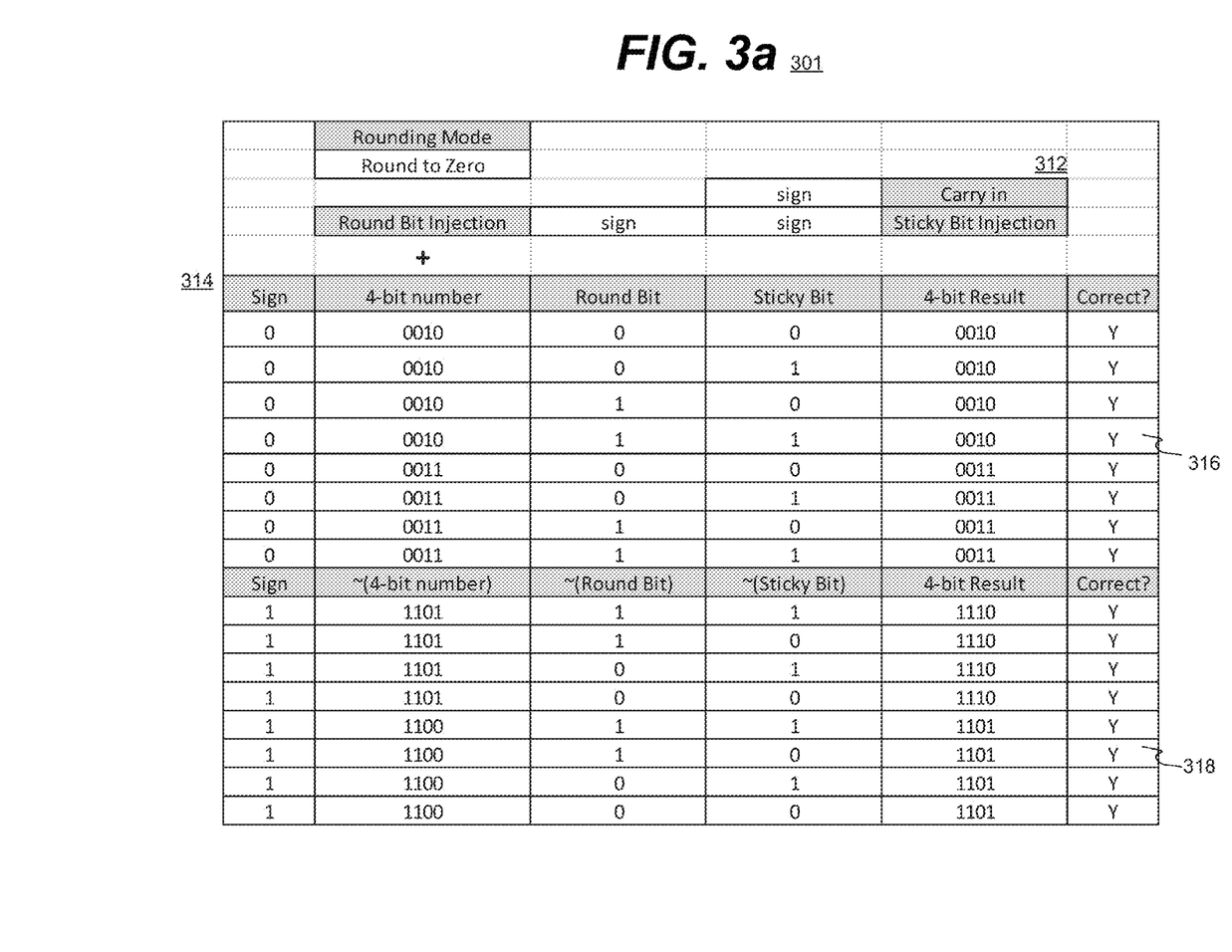
FIG. 3a is a diagram of example values employed in one embodiment of a system in accordance with the disclosed subject matter.

FIG. 3a is a diagram of tables 312 and 314 showing an illustrative example of an embodiment of the disclosed subject matter. In various embodiments, the values (e.g., floating-point number, round bit, sticky bit, injection constants, etc.) shown in tables 312 and 314 may be used with a floating-point conversion unit, such as that of FIG. 1. Specifically, the example shown in FIG. 3a involves a case in which the rounding mode is set to "Round to Zero". It is understood that the above is merely one illustrative example to which the disclosed subject matter is not limited.

Table 312 illustrates that, in one embodiment, the injection constants may be set to the same value as the sign bit of the floating-point number. In such an embodiment, as the floating-point number changes from positive to negative, the value of the injection constants may change too.

Table 314 illustrates a number of possible values for the input floating point number and the respective round bit and sticky bit. Two illustrative example cases will be discussed. In the case of row 316, the floating-point value may be 0010, the round bit may be 1, the sticky bit may be 1, and the sign bit may be 0 (a positive number). In such an embodiment, the normalized number may be 001011 (the floating-point number with the round and sticky bits concatenated to the LSB). The injection constant, based upon the sign bit, may be 00 with a carry-in bit of 0. The output of the adder may be 001011+00+0=001011. The two LSBs may then be removed, leaving an integer result of 0010 (or 2 in decimal).

In the case of row 318, the one's complement of the floating-point value may be 1100, the round bit may be 1, the sticky bit may be 0, and the sign bit may be 1 (a negative number). In such an embodiment, the normalized number may be 110010 (the floating-point number with the round and sticky bits concatenated to the LSB). The injection constant, based upon the sign bit, may be 11 with a carry-in bit of 1. The output of the adder may be 110010+11+

1=110110. The two LSBs may then be removed, leaving an integer result of 1101 (or −3 in decimal). Likewise, the similar example cases illustrated in FIG. 3a may show the computation of the integer result for various input values. It is understood that the above are merely a few illustrative examples to which the disclosed subject matter is not limited.

Figure 3B:
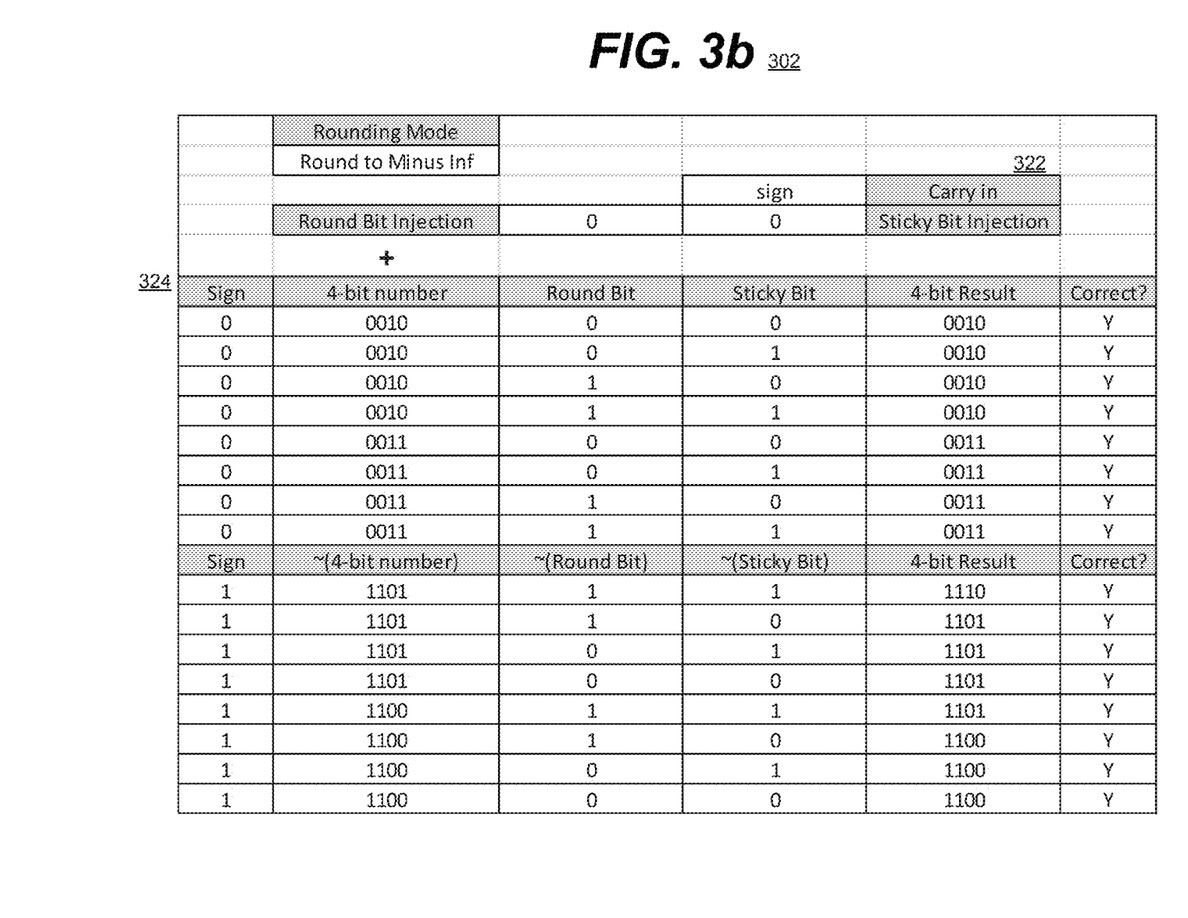
FIG. 3b is a diagram of example values employed in one embodiment of a system in accordance with the disclosed subject matter.

FIG. 3b is a diagram of tables 322 and 324 showing another illustrative example of an embodiment of the disclosed subject matter. In various embodiments, the values (e.g., floating-point number, round bit, sticky bit, injection constants, etc.) shown in tables 322 and 324 may be used with a floating-point conversion unit, such as that of FIG. 1. Specifically, the example shown in FIG. 3b involves a case in which the rounding mode is set to "Round to Minus Infinity". It is understood that the above is merely one illustrative example to which the disclosed subject matter is not limited.

Table 322 illustrates that, in one embodiment, the round bit and sticky bit injection constants may be set to zero. Further, the carry-in bit may be equal to the value of the floating-point number's sign bit. Table 324 illustrates a number of possible values for the input floating point number and the respective round bit and sticky bit, and the resultant integer value. In the illustrated embodiment, the example cases may be similar to those described above in reference to FIG. 3a. It is understood that the above are merely a few illustrative examples to which the disclosed subject matter is not limited.

Figure 3C:
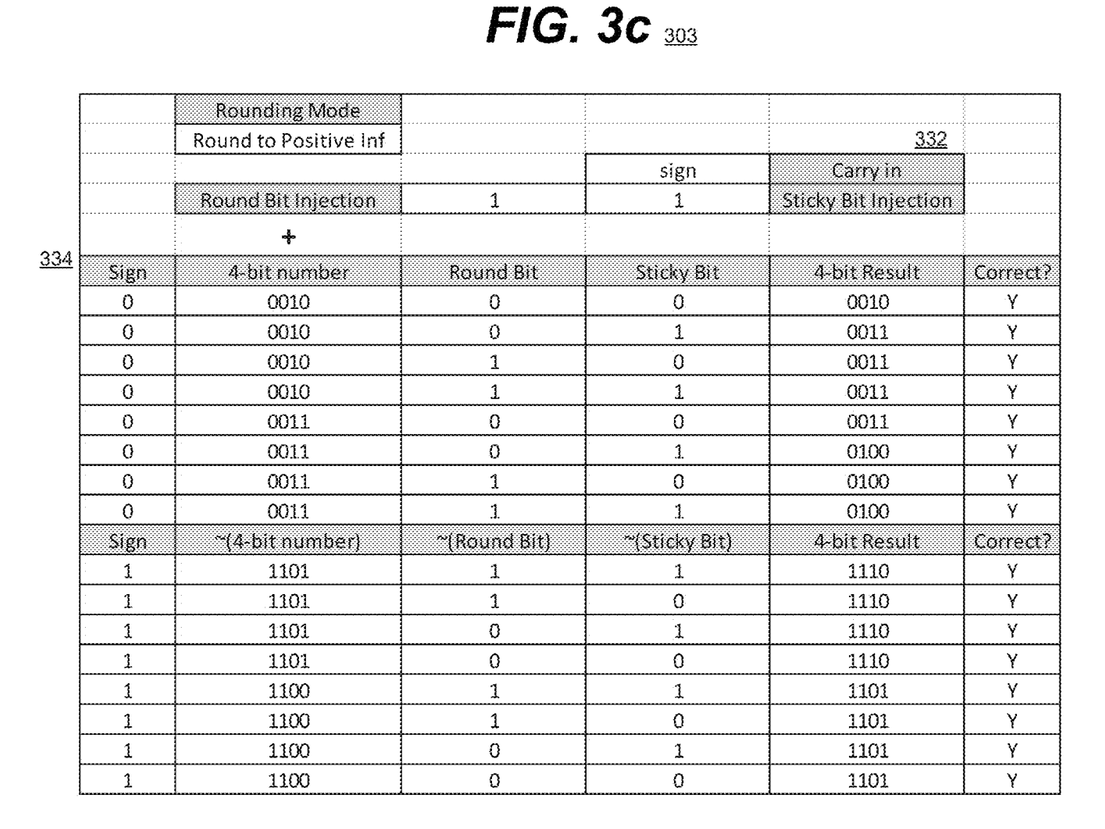
FIG. 3c is a diagram of example values employed in one embodiment of a system in accordance with the disclosed subject matter.

FIG. 3c is a diagram of tables 332 and 334 showing another illustrative example of an embodiment of the disclosed subject matter. In various embodiments, the values (e.g., floating-point number, round bit, sticky bit, injection constants, etc.) shown in tables 332 and 334 may be used with a floating-point conversion unit, such as that of FIG. 1. Specifically, the example shown in FIG. 3c involves a case in which the rounding mode is set to "Round to Positive Infinity". It is understood that the above is merely one illustrative example to which the disclosed subject matter is not limited.

Table 332 illustrates that, in one embodiment, the round bit and sticky bit injection constants may be set to one. Further, the carry-in bit may be equal to the value of the floating-point number's sign bit. Table 334 illustrates a number of possible values for the input floating point number and the respective round bit and sticky bit, and the resultant integer value. In the illustrated embodiment, the example cases may be similar to those described above in reference to FIG. 3a. It is understood that the above are merely a few illustrative examples to which the disclosed subject matter is not limited.

FIG. 3d is a diagram of tables 342 and 344 showing another illustrative example of an embodiment of the disclosed subject matter. In various embodiments, the values (e.g., floating-point number, round bit, sticky bit, injection constants, etc.) shown in tables 342 and 344 may be used with a floating-point conversion unit, such as that of FIG. 1. Specifically, the example shown in FIG. 3d involves a case in which the rounding mode is set to "Round to Nearest Even". It is understood that the above is merely one illustrative example to which the disclosed subject matter is not limited.

Table 342 illustrates that, in one embodiment, the round bit injection constant may be set to one and the sticky bit injection constant may be set to zero. Further, the carry-in bit may be equal to the value of the floating-point number's sign bit. Table 344 illustrates a number of possible values for the input floating point number and the respective round bit and sticky bit, and the resultant integer value. In the illustrated embodiment, the example cases may be similar to those described above in reference to FIG. 3a. However, in two cases, shown at rows 346 and 348, the LSB of the integer result may be incorrect and the effects of the LSB Correction circuit may be desirable. In such an embodiment, the LSB Correction circuit may revise the LSB of the integer result to the mathematically correct value. It is understood that the above are merely a few illustrative examples to which the disclosed subject matter is not limited.

FIG. 4 is a diagram of an embodiment circuit, specifically a LSB Correction circuit 400, of the disclosed subject matter. In various embodiments, this LSB Correction circuit 400 may be employed to correct inaccurate LSBs as shown in FIG. 3d.

In various embodiments, the LSB Correction circuit 400 may include an activation circuit 402. In the illustrated embodiment, the activation circuit 402 may include a three input AND circuit that receives as input a signal 412 that indicates whether or not the rounding mode is "Round to Nearest Even", the Round bit 414, and an inversion of the Sticky bit 416.

In some embodiments, the LSB Correction circuit 400 may include a correction circuit 404. In the illustrated embodiment, the correction circuit 404 may include a two input AND circuit that receives as input the LSB of the rounded integer result 418, and an inversion of the output of the activation circuit 402. The output of the correction circuit 404 may be a corrected LSB 420. It is understood that the above is merely one illustrative example to which the disclosed subject matter is not limited.

Figure 5:
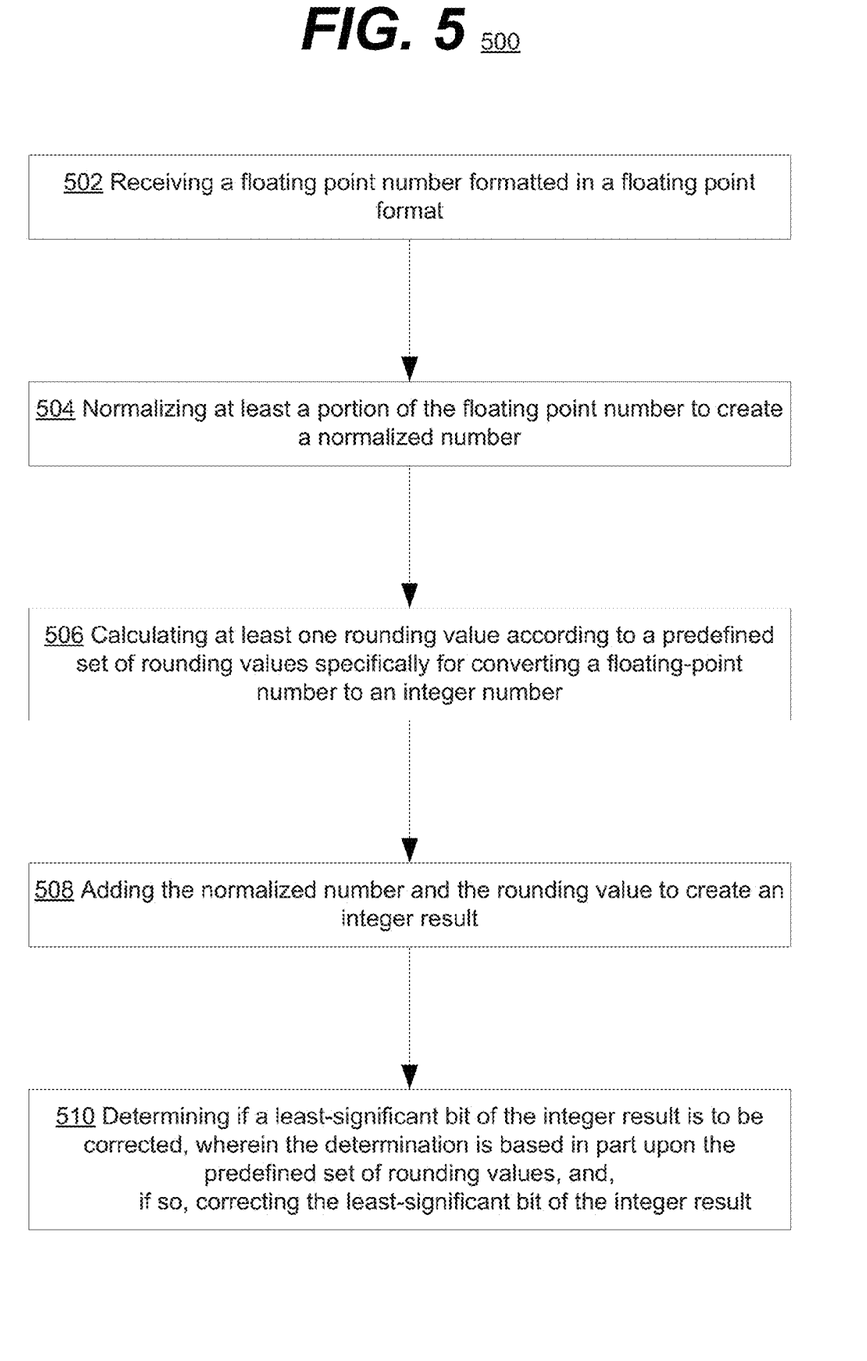
FIG. 5 is a flowchart of an example embodiment of a technique in accordance with the disclosed subject matter.

FIG. 5 is a flow chart of an example embodiment of a technique in accordance with the disclosed subject matter. In various embodiments, the technique 500 may be used or produced by the systems such as those of FIG. 1 or 6. Furthermore, portions of technique 500 produce results such as those illustrated by FIG. 3a, 3b, 3c, or 3d. Although, it is understood that the above are merely a few illustrative examples to which the disclosed subject matter is not limited. It is understood that the disclosed subject matter is not limited to the ordering of or number of actions illustrated by technique 500.

Block 502 illustrates that, in one embodiment, a floating-point number may be received, as described above. In various embodiments, the floating-point number may be formatted in the floating-point format that includes a sign bit, mantissa, and exponent portion, as described above. In various embodiments, one or more of the action(s) illustrated by this Block may be performed by the apparatuses or systems of FIG. 1 or 6, the memory 102 of FIG. 1, as described above.

Block 504 illustrates that, in one embodiment, at least a portion of the floating-point number may be normalized to create a normalized number, as described above. In various embodiments, normalizing at least a portion of the floating point number may include, if the floating point number is negative, inverting, via a one's complement, a normalized version of the floating point number, as described above. In various embodiments, one or more of the action(s) illustrated by this Block may be performed by the apparatuses or systems of FIG. 1 or 6, the normalization engine 104 of FIG. 1, as described above.

Block 506 illustrates that, in one embodiment, at least one rounding value may be calculated according to a predefined set of rounding values specifically for converting a floating-point number to an integer number, as described above. In various embodiments, at least one rounding value may include a rounding injection bit, a sticky injection bit, and a carry-in value, as described above. In some embodiments, at least one rounding value may include a carry in bit equal to a sign bit of the floating-point number. In one embodiment, the rounding value may include, if instructed to round to zero, a round injection bit and a sticky injection bit both equal to the sign bit of the floating point number. In another embodiment, the rounding value may include, if instructed to round to minus infinity, a round injection bit and a sticky injection bit both equal to zero, as described above. In yet another embodiment, the rounding value may include, if instructed to round to positive infinity, a round injection bit and a sticky injection bit both equal to one, as described above. In some embodiments, the rounding value may include, if instructed to round to a nearest even value, a round injection bit equal to one and a sticky injection bit equal to zero, as described above. In various embodiments, one or more of the action(s) illustrated by this Block may be performed by the apparatuses or systems of FIG. 1 or 6, a memory including the table 200 of FIG. 2, as described above.

Block 508 illustrates that, in one embodiment, the normalized number and the rounding value may be added together to create an integer result, as described above. In various embodiments, adding the normalized number and the rounding value to create an integer result comprises adding only the normalized number with the rounding value, as described above. In such an embodiment, creating an integer result may occur with only a single full adder and without the use of adding stages or adding three or more values together; although, it is understood that the above is merely one illustrative example to which the disclosed subject matter is not limited. In another embodiment, the integer result may include an integer value in an unsigned format, as described above. In yet another embodiment, the integer result may include an integer value formatted in a two's complement format. In various embodiments, one or more of the action(s) illustrated by this Block may be performed by the apparatuses or systems of FIG. 1 or 6, the adder 110 of FIG. 1, as described above.

Block 510 illustrates that, in one embodiment, a determination may be made as to whether a least-significant bit of the integer result is to be corrected, as described above. In such an embodiment, the determination may be based in part upon the predefined set of rounding values, as described above. In such an embodiment, if the least-significant bit of the integer result is to be corrected, the least-significant bit of the integer result may be corrected, as described above. In various embodiments, one or more of the action(s) illustrated by this Block may be performed by the apparatuses or systems of FIG. 1 or 6, the LSB correction circuit 118 of FIG. 1, as described above.

Figure 6:
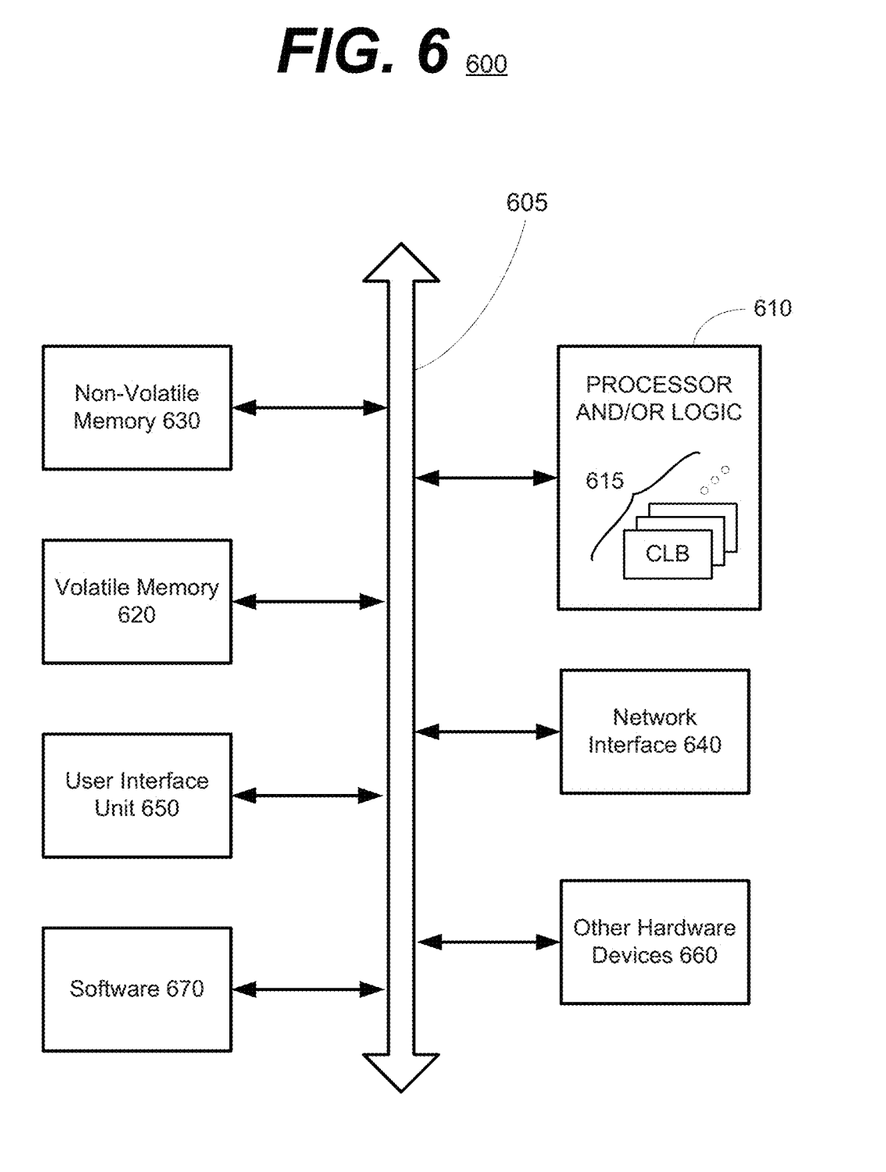
FIG. 6 is a schematic block diagram of an information processing system that may include devices formed according to principles of the disclosed subject matter.

FIG. 6 is a schematic block diagram of an information processing system 600, which may include semiconductor devices formed according to principles of the disclosed subject matter.

Referring to FIG. 6, an information processing system 600 may include one or more of devices constructed according to the principles of the disclosed subject matter. In another embodiment, the information processing system 600 may employ or execute one or more techniques according to the principles of the disclosed subject matter.

In various embodiments, the information processing system 600 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 600 may be used by a user (not shown).

The information processing system 600 according to the disclosed subject matter may further include a central processing unit (CPU), logic, or processor 610. In some embodiments, the processor 610 may include one or more functional unit blocks (FUBs) or combinational logic blocks (CLBs) 615. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 600 according to the disclosed subject matter may further include a volatile memory 620 (e.g., a Random Access Memory (RAM), etc.). The information processing system 600 according to the disclosed subject matter may further include a non-volatile memory 630 (e.g., a hard drive, an optical memory, a NAND or Flash memory, etc.). In some embodiments, either the volatile memory 620, the non-volatile memory 630, or a combination or portions thereof may be referred to as a "storage medium". In various embodiments, the volatile memory 620 and/or the non-volatile memory 630 may be configured to store data in a semi-permanent or substantially permanent form.

In various embodiments, the information processing system 600 may include one or more network interfaces 640 configured to allow the information processing system 600 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 600 according to the disclosed subject matter may further include a user interface unit 650 (e.g., a display adapter, a haptic interface, a human interface device, etc.). In various embodiments, this user interface unit 650 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 600 may include one or more other devices or hardware components 660 (e.g., a display or monitor, a keyboard, a mouse, a camera, a fingerprint reader, a video processor, etc.). It is understood that the above are merely a few illustrative examples to which the disclosed subject matter is not limited.

The information processing system 600 according to the disclosed subject matter may further include one or more system buses 605. In such an embodiment, the system bus 605 may be configured to communicatively couple the processor 610, the volatile memory 620, the non-volatile memory 630, the network interface 640, the user interface unit 650, and one or more hardware components 660. Data processed by the processor 610 or data inputted from outside of the non-volatile memory 630 may be stored in either the non-volatile memory 630 or the volatile memory 620.

In various embodiments, the information processing system 600 may include or execute one or more software components 670. In some embodiments, the software components 670 may include an operating system (OS) and/or an application. In some embodiments, the OS may be configured to provide one or more services to an application and manage or act as an intermediary between the application and the various hardware components (e.g., the processor 610, a network interface 640, etc.) of the information processing system 600. In such an embodiment, the information processing system 600 may include one or more native applications, which may be installed locally (e.g., within the non-volatile memory 630, etc.) and configured to be executed directly by the processor 610 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 610.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   a memory configured to store a floating point number formatted in a floating point format;
   a normalization engine configured to normalize at least a portion of the floating point number to create a normalized number;
   a lookup table configured to generate an injection constant based upon a rounding mode for converting a floating-point number to an integer number; and
   an adder configured to create an integer result by adding the normalized number and the injection constant.

2. The apparatus of claim 1, wherein the adder is configured to only add the normalized number and the injection constant.

3. The apparatus of claim 1, wherein the injection constant comprises a round injection bit, a sticky injection bit, and a carry-in value.

4. The apparatus of claim 1, wherein the injection constant comprises:
   a carry in bit equal to a sign bit of the floating point number; and
   if instructed to round to zero, a round injection bit and a sticky injection bit both equal to the sign bit of the floating point number,
   if instructed to round to minus infinity, a round injection bit and a sticky injection bit both equal to zero,
   if instructed to round to positive infinity, a round injection bit and a sticky injection bit both equal to one, and
   if instructed to round to a nearest even value, a round injection bit equal to one and a sticky injection bit equal to zero.

5. The apparatus of claim 1, wherein the normalization engine is configured to, if the floating point number is negative, invert, via a one's complement, a normalized version of the floating point number.

6. The apparatus of claim 1, further comprising:
   a least-significant bit correction circuit configured to determine if a least-significant bit of the integer result is to be corrected, wherein the determination is based in part upon the predefined set of injection constants.

7. The apparatus of claim 1, wherein the integer result comprises an integer value formatted in a two's complement format.

8. The apparatus of claim 1, wherein the integer result comprises an integer value in an unsigned format.

9. A method comprising
receiving a floating point number formatted in a floating point format;
normalizing at least a portion of the floating point number to create a normalized number;
calculating at least one rounding value according to a rounding mode for converting a floating-point number to an integer number; and
adding the normalized number and the rounding value to create an integer result.

10. The method of claim 9, wherein adding the normalized number and the rounding value to create an integer result comprises adding only the normalized number with the rounding value.

11. The method of claim 9, wherein the at least one rounding value comprises a rounding injection bit, a sticky injection bit, and a carry-in value.

12. The method of claim 9, wherein the at least one rounding value comprises:
a carry in bit equal to a sign bit of the floating point number; and
if instructed to round to zero, a round injection bit and a sticky injection bit both equal to the sign bit of the floating point number,
if instructed to round to minus infinity, a round injection bit and a sticky injection bit both equal to zero,
if instructed to round to positive infinity, a round injection bit and a sticky injection bit both equal to one, and
if instructed to round to a nearest even value, a round injection bit equal to one and a sticky injection bit equal to zero.

13. The method of claim 9, wherein normalizing at least a portion of the floating point number comprises:
if the floating point number is negative, inverting, via a one's complement, a normalized version of the floating point number.

14. The method of claim 9, further comprising:
determining if a least-significant bit of the integer result is to be corrected, wherein the determination is based in part upon the rounding mode, and
if so, correcting the least-significant bit of the integer result.

15. The method of claim 9, wherein the integer result comprises an integer value formatted in a two's complement format.

16. The method of claim 9, wherein the integer result comprises an integer value in an unsigned format.

17. A system comprising:
a memory configured to store a floating point number formatted in a floating point format; and
a floating-point conversion unit configured to convert a floating point number to an integer number and comprising:
a normalization engine configured to normalize at least a portion of the floating point number to create a normalized number,
a lookup table configured to generate an injection constant based upon a rounding mode for converting a floating-point number to an integer number, and
an adder configured to create an integer result by adding the normalized number and the injection constant.

18. The system of claim 17, wherein the adder is configured to only add the normalized number and the injection constant.

19. The system of claim 17, wherein the injection constant comprises:
a carry in bit equal to a sign bit of the floating point number; and
if instructed to round to zero, a round injection bit and a sticky injection bit both equal to the sign bit of the floating point number,
if instructed to round to minus infinity, a round injection bit and a sticky injection bit both equal to zero,
if instructed to round to positive infinity, a round injection bit and a sticky injection bit both equal to one, and
if instructed to round to a nearest even value, a round injection bit equal to one and a sticky injection bit equal to zero.

20. The system of claim 17, wherein the integer result comprises an integer value formatted in a two's complement format.

* * * * *